(12) United States Patent
Akiyama

(10) Patent No.: US 6,403,467 B1
(45) Date of Patent: Jun. 11, 2002

(54) SEMICONDUCTOR DEVICE AND METHOD FOR MANUFACTURING SAME

(75) Inventor: Naoto Akiyama, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/460,997

(22) Filed: Dec. 14, 1999

(30) Foreign Application Priority Data

Dec. 14, 1998 (JP) .......................................... 10-355135

(51) Int. Cl.⁷ .......................................... H01L 21/4763
(52) U.S. Cl. ........................ 438/629; 438/631; 438/637
(58) Field of Search .............................. 438/626, 624, 438/631, 633, 637; 257/773, 774

(56) References Cited

U.S. PATENT DOCUMENTS

| | | | | |
|---|---|---|---|---|
| 5,200,807 A | * | 4/1993 | Eguchi | 257/758 |
| 5,847,466 A | * | 12/1998 | Ito et al. | 257/775 |
| 5,923,088 A | * | 7/1999 | Shiue et al. | 257/758 |
| 6,150,725 A | * | 11/2000 | Misawa et al. | 257/781 |

FOREIGN PATENT DOCUMENTS

| | | |
|---|---|---|
| JP | 6-318590 | 11/1994 |
| JP | 7-161720 | 6/1995 |
| JP | 9-162290 | 6/1997 |
| JP | 9-219451 | 8/1997 |
| JP | 10-189603 | 7/1998 |

* cited by examiner

Primary Examiner—Kevin M. Picardat
(74) Attorney, Agent, or Firm—Hutchins, Wheeler & Dittmar

(57) ABSTRACT

In a method for manufacturing a semiconductor device, a first insulation film is grown on a semiconductor substrate, a first interconnect is formed thereover, and a second insulation film is grown over the first insulation film, including the first interconnect. A first connecting via hole, disposed at an edge part of the first interconnect, and a second connecting via hole, disposed at the center part thereof, are then formed, a metal film being additionally grown on the second insulation film, after which chemical metal polishing is used to remove the metal film, over which is formed a second interconnect.

3 Claims, 3 Drawing Sheets

Fig. 1 (A)
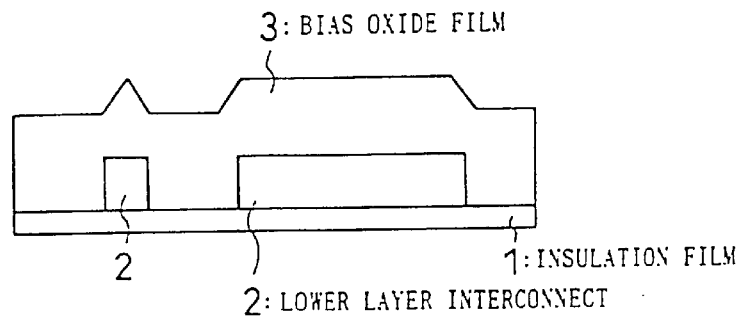
Fig. 1 (B)
Fig. 1 (C)
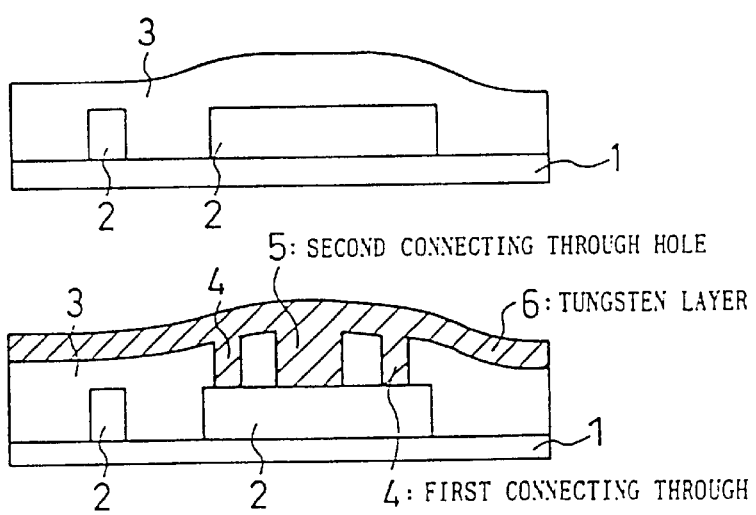
Fig. 1 (D)
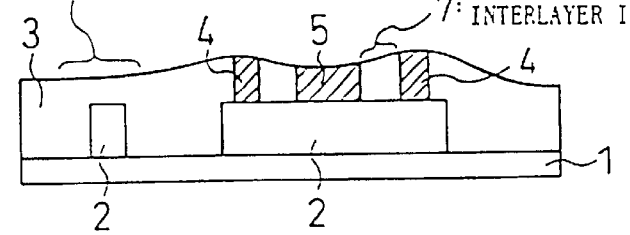
Fig. 1 (E)
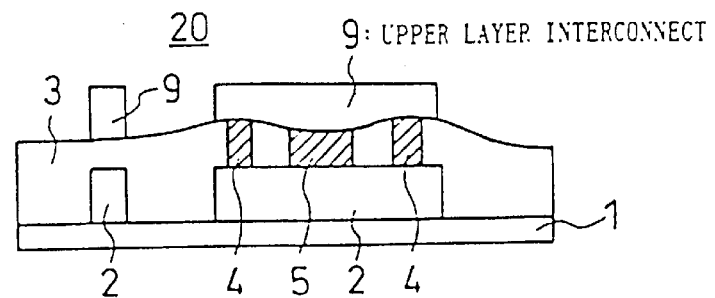

(A)

(B)

(C)

(A)

(B)

SEMICONDUCTOR DEVICE AND METHOD FOR MANUFACTURING SAME

BACKGROUND OF THE INVENTION

1. Field of the Invention

The present invention relates to a semiconductor device and a method for manufacturing a semiconductor device, and more particularly to a semiconductor device preferable for flattening of an interlayer film over interconnects having a large surface area, and to a method for manufacturing such a semiconductor device.

2. Background of the Invention

In the past, in a semiconductor device having a multilayer interconnect structure, because a step occurring in the lower interconnect layer made it difficult to form a high-reliability upper interconnect layer, there was an important need to flatten the surface of the interlayer film.

For this reason, when manufacturing a semiconductor device, a manufacturing process such as shown in FIG. 4, was generally used.

Specifically, an insulation film 1 was grown on a semiconductor substrate (not shown in the drawing) and a lower interconnects 2 were formed thereover.

Then, a bias oxide film 3 was grown over the insulation film 1 onto which was formed the lower interconnects 2 (FIG. 4(A)).

After the above steps, chemical mechanical polishing (CMP) was used to remove the surface of the bias oxide film 3 (FIG. 4(B)), thereby making the upper surface of the bias oxide film 3 flat.

Next, a connecting through hole 4 through the entire bias oxide film 3 and reaching the lower interconnect layer 2 is formed, after which an upper interconnect layer 9 is formed thereover (FIG. 4(C)).

If the surface area of the lower interconnect layer is large, however, the surface area of the bias oxide film 3 formed thereover will also be large, the result being that, in the process step whereby CMP is used to remove the bias oxide film 3, it is difficult to remove the bias oxide film 3.

For this reason, there are protrusions on the upper surface of the bias oxide film 3, this resulting in an overall global step at the chip level.

If the surface area of the lower interconnect layer 2 is large, one approach that is used is that of removing the center part of the lower interconnect layer 2 so as to reduce the surface area of the bias oxide film 3 on the lower interconnect layer 2, thereby facilitating the removal of the bias oxide film 3 formed on the lower interconnect layer 2 using CMP.

Using the above-noted method, by making efficient use of the sputtering effect that occurs when the bias oxide film 3 is grown, the amount of bias oxide film 3 removed by CMP is reduced, so that if the lower interconnect layer 2 has a large surface area, it is possible to reduce the step on the upper surface of the bias oxide film 3.

When the center part of the lower interconnect layer 2 is removed, however, there is a reduction in the level of integration of the lower interconnect layer.

For this reason, in order to achieve reliability in the lower interconnect layer, one method that can be envisioned is that of widening the pitch of the lower level interconnects.

However, when the center part the lower interconnect layer is removed but the interconnect pitch on the lower interconnect layer is not widened, because of a reduction in the cross-sectional area of the lower layer of interconnects, the reliability of the interconnects in the semiconductor device is reduced.

Accordingly, it is an object of the present invention to provide a method for manufacturing a semiconductor device which flattens the interlayer insulation film without removing the center part of the lower interconnect layer, and a semiconductor device that is manufactured according to this method, thereby solving the above-noted problems inherent in the prior art.

SUMMARY OF THE INVENTION

In order to achieve the above-noted object, the present invention basically has the following technical conception and in that a first aspect of the present invention provides a semiconductor device which comprises a first interconnect, a second interconnect provided in opposite to the first interconnect, and an insulation film provided between the first and second interconnects, wherein the first and second interconnects are connected to each other via a plurality of metal members each of which being provided inside of each one of a plurality of connecting via holes disposed in the insulation film, respectively.

And further, in that a second aspect of the present invention provides a method for manufacturing a semiconductor device, comprising, a step of growing a first insulation film on a semiconductor substrate, a step of forming a first interconnect on the first insulation film, a step of growing a second insulation film on the first insulation film, including the first interconnect, a step of providing a first connecting via hole in the insulation film and disposed at a position closed to an edge part of the first interconnect and a second connecting via hole in the insulation film and disposed at the center part thereof, a step of growing a metal film on the second insulation film, and a step of removing the metal film using chemical and mechanical polishing.

BRIEF DESCRIPTION OF THE DRAWINGS

FIG. 1(A) and FIG. 1(E) are drawings showing the process of manufacturing one embodiment of a semiconductor device according to the present invention.

DESCRIPTION OF THE PREFERRED EMBODIMENTS

Figure 2:
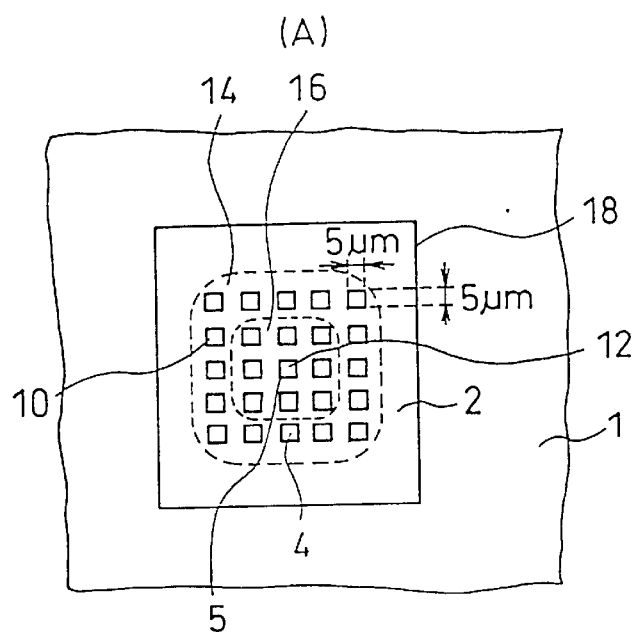
FIG. 2(A) to FIG. 2(C) are drawings showing the connecting via hole of other embodiments of a semiconductor device according to the present invention, respectively.
Figure 2:
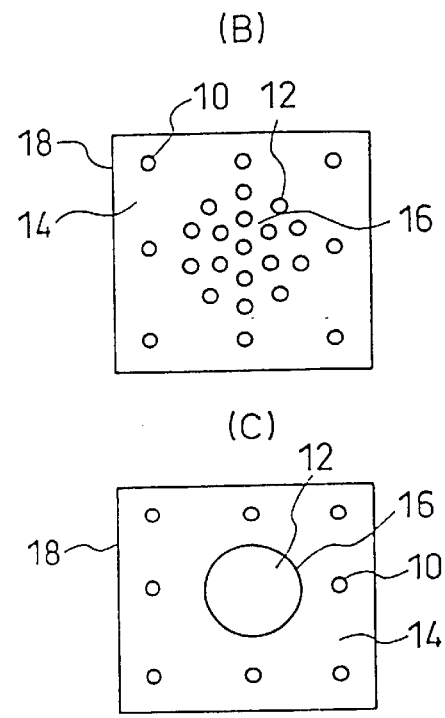

Preferred embodiments of the present invention are described below, with reference being made to relevant accompanying drawings.

FIG. 1(E) shows one embodiment of the semiconductor device produced by the present invention and it is illustrated that a semiconductor device 20 which comprises a first interconnect 2 formed on a surface of a insulation film 1, a second interconnect 9 provided in opposite to the first interconnect 2, and an insulation film 3 provided between the first and second interconnects 2, 9, and wherein the first and second interconnects 2, 9 are connected to each other via a plurality of metal members 10, 12, each of which being provided inside of each one of a plurality of connecting via holes 4, 5 disposed in the insulation film 3, respectively.

Note that in other word, the semiconductor device according to the present invention has a first interconnect 2, a second interconnect 9, and an insulation film 3 disposed between the first interconnect and the second interconnect 2, 9, wherein the first interconnect 2 and the second interconnect 9 are connected via the metals 10 and 12 that fill a first connecting via hole 4 disposed at the edge part of the first interconnect 2 and a second connecting via hole 5 disposed at the center part thereof, respectively.

In the present invention, based on the ease of polishing of a trench using CMP and the ease of polishing that is enhanced the smaller is the surface area of the interlayer insulation film between the connecting via holes, by removing the interlayer insulation film on the lower interconnect, which has a large surface area, the overall surface of the interlayer insulation film is flattened.

On the other hand, FIG. 1(A) to FIG. 1(E) show one embodiment of a method for producing above-mentioned semiconductor device.

In that, it is shown that a method for manufacturing a semiconductor device, comprising a step of growing a first insulation film on a semiconductor substrate, a step of forming a first interconnect on the first insulation film, a step of growing a second insulation film on the first insulation film, including the first interconnect, a step of providing a first connecting via hole in the insulation film and disposed at a position closed to an edge part of the first interconnect and a second connecting via hole in the insulation film and disposed at the center part thereof, a step of growing a metal film on the second insulation film, and a step of removing the metal film using chemical and mechanical polishing.

More specifically, the method for manufacturing a semiconductor device according to the present invention may comprise the following steps of a step of growing a first insulation film on a semiconductor substrate, a step of forming a first interconnect on the first insulation film, a step of growing a second insulation film on the first insulation film, including the first interconnect, a step of providing on the first insulation film a first connecting via hole disposed at the position of an edge part of a first interconnect and a second connecting via hole disposed at the center part thereof, a step of growing a metal film on the second insulation film, a step of removing the metal film using chemical metal polishing, and a step of forming a second interconnect thereon.

Hereunder, one specific embodiment of a method for producing the semiconductor device of the present invention will be explained in detail with referring to FIG. (A) to (E).

FIG. 1 shows the first embodiment of the present invention as a series of manufacturing process drawings for manufacturing the first embodiment.

First, an insulation film 1 is formed on a semiconductor substrate (not shown in the drawing), as shown in FIG. 1(A).

Then, a plurality of lower-layer interconnects 2 are formed on the surface of the insulation film 1 as first interconnects (two being shown in FIG. 1).

Over these, a bias oxide film 3, which will serve as an interlayer insulation film, is grown on the entire surface, to a thickness of approximately 2 $\mu$m, for example.

Of the lower-layer interconnects 2, one has a larger surface area than the other.

Next, the bias oxide film 3 is polished using CMP. By doing this, because the bias oxide film 3 on the lower interconnect 2 having a small surface area, is removed, but the bias oxide film 3 on the lower interconnect 2 having a large area is not removed, there is a global step formed on the surface of the bias oxide film 3, as shown in FIG. 1(B).

Next, as shown in FIG. 1(C), a first connecting via hole 4 having, for example, a diameter of approximately 0.5 $\mu$m, is formed through the bias oxide film 3 so as to extend to the edge part of the lower interconnect 2, and then a second connecting via hole 5 of approximate diameter ranging from 1 to 30 $\mu$m is formed in the center part of the lower interconnect 2, these being formed by etching.

Then, CVD or the like is used to grow a tungsten filling layer 6 used as the metal members, to a thickness of approximately 0.8 $\mu$m on the bias oxide film 3.

The second connecting via hole 5 can be made a size such that when CMP is done of the tungsten layer 6 there is effective removal of the bias oxide film 3 over the lower-layer interconnect 2 having a large surface area.

The thickness of the tungsten layer 6 is established as a thickness sufficient to bury the first connecting via hole 4 and the second connecting via hole 5.

The second connecting via hole 5 is disposed in a square shape, for example, in the center part of the lower interconnect 2. In addition to this square shape, the second connecting via hole 5 can be made an arbitrary shape such as a polygon or a circle.

Next, as shown in FIG. 1(D), the tungsten layer 6 is removed by CMP, so that the remaining tungsten layer 6 fills the first connecting via hole 4 and the second connecting via hole 5.

When this is done, the amount of polishing done to the tungsten layer 6 at the center part of the second connecting via hole 5 is greater than the peripheral part, so that a surface area of the insulation film 3 disposing at around the center portion of the second interconnect 2 and including the second connecting via hole 5, shows a concaved configuration as shown in FIG. 1(E).

Additionally, when the tungsten layer 6 is subjected to CMP, the surface of the first interlayer insulation film 7, which is the region near the second connecting via holes 5, has more of the oxide film removed than the region 8 of the second interlayer insulation film 3 that is not provided with a connecting via hole 4, 5.

For this reason, it is possible to remove the bias oxide film 3 on the lower interconnect 2 until the desired bias oxide thickness is reached.

After this is done, an upper interconnect (second interconnect) is formed thereover.

Therefore, as shown in FIG. 1(E), it is possible to manufacture a semiconductor device having a bias oxide film 3 with a top surface having improved flatness.

In the semiconductor device of the present invention, the first metal members 10 of a part of the plurality of the metal members 10, 12 which are formed inside a first connecting via holes 4, are locating in an area 14 closed to an edge portion 18 of the interconnect, for example, the first interconnect 2, while a second metal members 12 of the rest part of the plurality of the metal members 10, 12 which are formed inside a second connecting via holes 5, are locating in an area 16 formed at around a center portion of the first interconnect 2.

Further, in the present invention, the number of or configuration of the cross-sectional area of each one of the first and the second metal members is not restricted and they can be optionally determined at discretion of users and also a pattern under with each one of the first and the second metal members are arranged can be optionally established in a case may be, though, a total amount of cross-sectional area summing up the cross-sectional areas of respective the second metal members 16 may preferably be larger than that summing up the cross-sectional areas of respective the first metal members 10, as shown in FIGS. 2(B) and 2(C), for example.

On the other hand, in the present invention, a number of the second metal members 12 may preferably outnumber that of the first metal members 10 when the cross-sectional area of the first metal members 10 are similar to those of the second metal members 12, as shown in FIG. 2(B), for example.

More over, in the present invention, each one of the second metal members 12 may have a cross-sectional area being larger than that of each one of the first metal members 10, as shown in FIG. 2(C), for example.

FIG. 2(A) shows the second embodiment of the present invention, this drawing showing a plan view of connecting via holes 4, 5 provided in the bias oxide film 3.

For the purpose of this description, the bias oxide film 3 itself is not shown. The manufacturing process steps before and after forming the connecting via holes 4, 5 in the bias oxide film are the same as described with regard to the first embodiment.

Each of the connecting via holes 4, 5 provided in the bias oxide film 3, in contrast to the first embodiment, has the same size and shape, the size of each of these connecting via holes 10, 12 being such that, when the tungsten layer (not shown in the drawing) is subjected to CMP, it is possible to effectively remove the bias oxide film that was grown on a lower interconnect 2 that has a large surface area. In this embodiment, the holes 4, 5 are squares that measure 0.5 μm on a side.

The connecting via holes 5 are disposed in a concentrated pattern in the center part 16 of the lower interconnects 2.

Tungsten (not shown in the drawing) is grown over this, after which when the tungsten layer serving as the metal members 10, 12 are polished using CMP, the bias oxide film 3 in proximity to the connecting via holes 4, 5 are an simultaneously polished.

For this reason, it is possible to remove the bias oxide film on the lower interconnects 2 having a large area to the desired thickness.

Thus, in this embodiment, similar to the case of the first embodiment, the surface of the interlayer insulation film 3 in proximity to the connecting via holes 5 is removed more than the surface of the interlayer insulation film region in which connecting via holes are not provided.

For this reason, it is possible to remove the bias oxide film 3 on the lower interconnects to the desired thickness. Therefore, it is possible to manufacture a semiconductor device having a bias oxide film 3 with a top surface having improved flatness.

Figure 3:
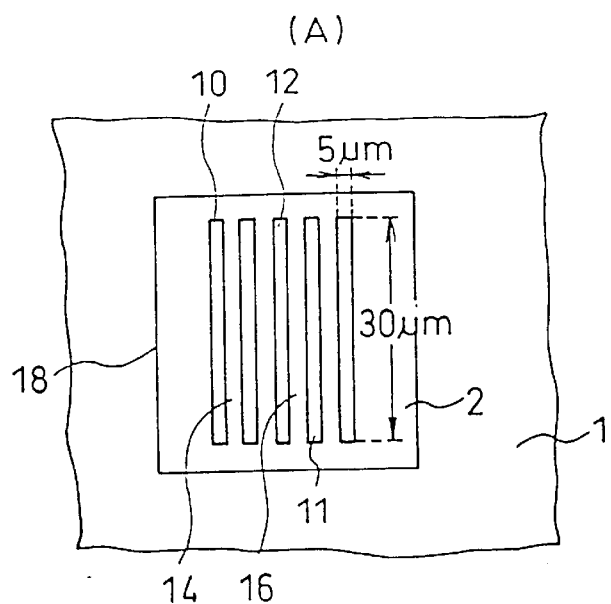
FIG. 3(A) and FIG. 3(B) are drawings showing the connecting via hole of a separate embodiment of a semiconductor device according to the present invention.
Figure 3:
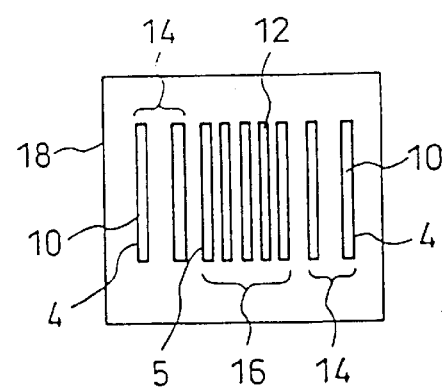
Figure 4:
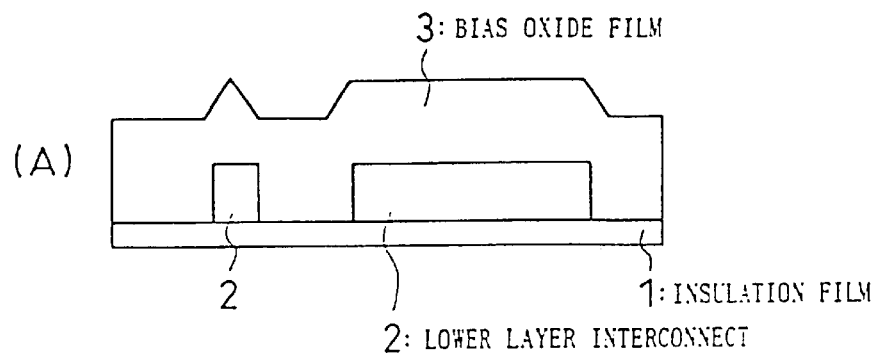
FIG. 4(A) to FIG. 4(C) are drawings showing the process of manufacturing a semiconductor device of the prior art.
Figure 4:
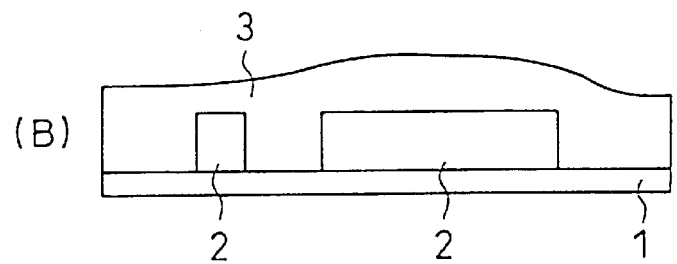
Figure 4:
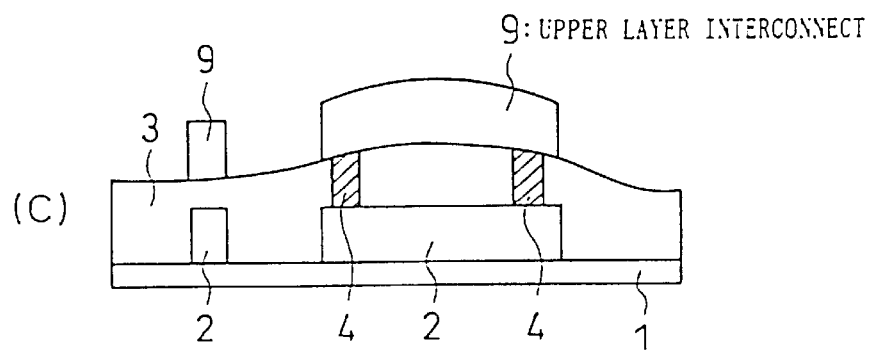

FIG. 3(A) shows the third embodiment of the present invention, this drawing showing a plan view of connecting via holes 5 provided in the bias oxide film.

For the purpose of this description, the bias oxide film 3 itself is not shown.

The manufacturing process steps before and after forming the connecting via holes 11 in the bias oxide film 3 are the same as described with regard to the first embodiment.

The lower interconnect layer 2 can take a variety of shapes. In the case of a semiconductor device in which the lower interconnect layer 2 is a series of vertical stripes, it is preferable to provide the connecting via holes 11 as in this embodiment.

The connecting via holes 11 are formed as a plurality of elongated holes that are mutually parallel. The width and length of the connecting via holes 11 are, for example, 5 μm and 30 μm, the length of these holes being made smaller the smaller are the lower layer interconnects 2.

Additionally, in this embodiment of the present invention, the plurality of connecting via holes 11 are disposed in a concentrated manner in the center part 16 of the of the lower layer interconnects 2 and so as to be mutually parallel.

Over the above structure tungsten (not shown in the drawing) is grown, after which the tungsten layer is removed by CMP, at which time the bias oxide film in proximity to the connecting via holes 11 is polished simultaneously with the tungsten layer.

For this reason, it is possible to removed the bias oxide film over the lower layer interconnects 2 having a large surface area to a small thickness.

According to the above-noted embodiment, similar to the case of the first embodiment, the surface of the interlayer insulation film in proximity to the connecting via holes 11 is removed more than the surface of the interlayer insulation film region in which the connecting via holes are not provided.

For this reason, it is possible to remove the bias oxide film 3 on the lower layer interconnects 2 to a small thickness. Therefore, it is possible to manufacture a semiconductor device having a bias oxide film 3 with a top surface having improved flatness.

In this embodiment, because the connecting via holes 11 are elongated holes, compared to the case of the second embodiment, in which the connecting via holes 10 are square (FIG. 2), the number of holes can be made small, thereby facilitating design of the interconnect layout.

As shown in FIG. 3(A), at least the second metal members 12 may have a cross sectional configuration having a longitudinal center axis and each being parallely arranged to each other along the longitudinal center axis thereof.

And a separate embodiment of the present invention from the third embodiment, as shown in FIG. 3(B), the second metal members 12 indicated in FIG. 3(A) may be arranged in a pattern under which they are arranged more closely to each other in a center area of the first interconnect 2, while the first metal members 10 are arranged relatively wider to each other in an area 14 closed to the edge portion.

According to the present invention as described in detail above, connecting via holes are provided in an interlayer insulation film over the first interconnect layer having a large surface area, and a filling metal is grown thereover, after which CMP polishing is done of the filling metal, enabling removal of not only the interlayer insulation film between the connecting via holes, but the filling metal as well.

This enables the achievement of a thin interlayer insulation film on the first interconnect layer 1.

Therefore, it is possible to flatten the overall surface of the interlayer insulation film, which has a step before subjecting it to CMP. It is therefore possible to achieve a semiconductor device with a flat interlayer insulation film, without removing the center part of the first interconnects.

What is claimed is:

1. A method for manufacturing a semiconductor device, comprising:

growing a first insulation film on a semiconductor substrate;

forming a first interconnect pattern on said first insulation film, wherein said interconnect pattern has at least one narrow line and at least one wide line;

growing a second insulation film on said first insulation film, including said first interconnect pattern;

providing at least a first connecting though hole in said second insulation film and disposed at a position proximate to an edge part of said at least one wide line of said first interconnect pattern, and at least a second connecting via hole in said second insulation film and disposed at the center part of said at least one wide line of said first interconnect pattern, and distant from the edge part;

growing a metal film on said second insulation film; and removing a portion of said metal film using chemical and mechanical polishing.

2. A method for manufacturing a semiconductor device according to claim 1, wherein said at least one second connecting via holes include a plurality of via holes provided at the center part of said at least one wide line of said first interconnect pattern.

3. A method for manufacturing a semiconductor device according to claim 2, wherein said at least one second connecting via holes at the center part of said at least one wide line of said first interconnect pattern are elongated and mutually arranged with respect to each other in parallel.

* * * * *